United States Patent [19]

Fukushima et al.

[11] 4,179,650
[45] Dec. 18, 1979

[54] VARIABLE IMPEDANCE CIRCUITS

[75] Inventors: Isao Fukushima, Fujisawa; Akihiro Asada, Yokohama; Kazuya Takahashi, Mito, all of Japan

[73] Assignee: Hitachi, Ltd., Japan

[21] Appl. No.: 864,266

[22] Filed: Dec. 27, 1977

[30] Foreign Application Priority Data

Dec. 27, 1976 [JP] Japan .................................. 51-156537

[51] Int. Cl.² ............................................. G05F 1/48
[52] U.S. Cl. ...................................... 323/1; 307/237;
323/79; 330/296
[58] Field of Search ................... 307/237, 264, 296 R,
307/297; 323/1, 4, 79, 81; 330/257, 261, 279,
288, 296, 297; 333/14

[56] References Cited

U.S. PATENT DOCUMENTS

| | | | |
|---|---|---|---|
| 3,761,741 | 9/1973 | Hoeft | 307/237 |
| 3,947,778 | 3/1976 | Hsiao et al. | 330/261 X |
| 4,004,242 | 1/1977 | Wheatley | 307/237 X |
| 4,041,409 | 8/1977 | Kominami et al. | 330/261 X |
| 4,051,428 | 9/1977 | Imai | 323/4 |
| 4,066,914 | 1/1978 | Gundry | 323/81 X |

*Primary Examiner*—A. D. Pellinen

*Attorney, Agent, or Firm*—Craig and Antonelli

[57] ABSTRACT

A variable impedance circuit comprises a differential current circuit having a diode and a first transistor connected so as to operate differentially with respect to each other, and a current control circuit for controlling current flowing through the differential current circuit, whereby variation of the operative resistance of the differential current circuit causes variation of impedance thereof. The current control circuit comprises a second transistor having a collector connected with the differential connection of the differential current circuit, and an emitter grounded via a resistor, and a third transistor having a base applied with a control voltage and an emitter connected with the emitter of the second transistor. A fourth transistor is also provided having a collector connected to the base of the second transistor, a base connected to the collector of the third transistor and an emitter applied with source voltage independently from the current flowing through the differential current circuit. The current control circuit is connected with the differential current circuit through only the collector of the second transistor to establish a high impedance of the current control circuit as seen by the differential current circuit.

7 Claims, 4 Drawing Figures

VARIABLE IMPEDANCE CIRCUITS

BACKGROUND OF THE INVENTION

This invention relates to a variable impedance circuit of the general type shown, for example, in U.S. Pat. No. 3,761,741 having an impedance which is varied through a control voltage. In particular, the invention is concerned with a variable impedance circuit in which possible generation of distortions in the impedance is suppressed to a minimum.

A variable impedance circuit providing an impedance which is variable through voltage control has found various applications. For example, such variable impedance circuit can be used for a variable highpass filter or variable attenuator in a Dolby circuit for decreasing noise upon recording and playback operations of magnetic tape recorders. In this case, the impedance is varied through a control voltage derived from the recording signal.

An important requirement imposed on the variable impedance circuit resides in that the circuit should exhibit impedance values which are not susceptible to voltages of other circuits to which the variable impedance circuit is connected, in order to have the distortions of impedance suppressed to a minimum. Further, the variable impedance circuit should provide a high impedance to the control voltage. Otherwise, current flow would be brought about due to the control voltage which would then be subjected to variation and make it impossible to obtain an impedance value proportional to the control voltage.

In hitherto known variable impedance circuits, field effect transistors or FET's have been employed so as to meet the requirements described above. However, the FET variable impedance circuits are difficult to manufacture in a semiconductor integrated circuit. There arises thus a demand for a variable impedance circuit constructed with transistor circuitries.

FIG. 1 shows an example of a hitherto known variable impedance circuit which is generally denoted by reference numeral 1 and composed of a differential current circuit 2 and a current control circuit 3.

The differential current circuitry 2 includes a first series connection of a diode 4 and an emitter-collector path of a transistor 7, and a second series connection of a diode 5 and an emitter-collector path of a transistor 6. The first and second series connection in turn are connected in parallel to each other with the transistor 6 being connected to the diode 4. The transistor 7 has a base connected to a junction between the diode 5 and the collector of the transistor 6 which is biased at the base thereof, while the transistor 7 is biased from a junction between the emitter thereof and the diode 5. The junction between the collector of the transistor 7 and the diode 4 constitutes a terminal 8 of the variable impedance circuit 1. The impedance of the circuit 1 as seen from the terminal 8 is an operating resistance of a circuit path extending from the terminal 8 through the diode 4 and the PN-junction between the base and emitter of the transistor 6 to a biasing voltage source 9, so far as the internal resistance of the current control circuitry 3 is sufficiently large. In this connection, the transistor 7 and the diode 5 serve to cause a current to flow toward a junction between the diode 4 and the emitter of the transistor 6. Accordingly, the impedance of this circuit is determined by a current flowing from a bias terminal 10 through the diode 4 and the transistor 6 to the current control circuitry 3. It is thus possible to vary the impedance by varying the current flowing through the current control circuitry 3.

As will be appreciated from the above description, there are formed two current paths in this circuit; i.e. one current path extends from the bias terminal 10 through the diode 4 to the current control circuitry 3, while the other current path extends from the bias terminal 10 through the transistor 6 to the current control circuitry 3.

Assuming now that another circuit is connected to the terminal 8 and a current is fed to the variable impedance circuit 1, the current flowing through the diode 4 will be increased, while the current flowing through the collector-emitter path of the transistor 6 will be decreased by the current flowing through the emitter-base path of the transistor 6.

On the other hand, assuming that a current is fed to a circuit connected to the terminal 8 from the variable impedance circuit, the current flowing through the diode 4 is caused to decrease, while the current flowing through the transistor 6 is increased.

Accordingly, a sum of the current flowing through the diode 4 and the current flowing through the transistor 6 will remain constant indepedently from whether current is fed to the terminal 8 or inversely fed from the terminal 8. Under such a condition, the value of impedance determined by the operating resistance of the base-emitter junction of the transistor 6 and the diode 4 will remain unvaried, as a result of which the value of impedance as seen from the terminal 8 is determined only by the current of the current control circuitry 3 on the assumption that the current control circuitry 3 has a sufficiently high impedance as compared with that of the differential current circuitry 2.

The current control circuitry 3 includes transistors 11, 12 and 13 and a resistor 14. The NPN-type transistor 11 has a collector connected to the base of the PNP-type transistor or 12, the collector of which in turn is connected to the base of the NPN-type transistor 13. With such circuit arrangement, the current $i_l$ due to a control voltage $V_c$ applied to the base of the transistor 11 is successibly amplified through the above mentioned transistors. The emitter of the transistor 12 and the collector of the transistor 13 are connected together to the differential current circuitry 2, while the emitters of the transistors 11 and 13 are grounded through the resistor 14.

Variation in the control voltage $V_c$ will bring about a corresponding variation in the current amplified through the transistors 11, 12 and 13, which in turn results in variation in the current flowing through the differential current circuitry 2, involving variation in impedance.

It should be noted herein that, in the case of the above described variable impedance circuit, the impedance of the current control circuitry 3 can not be sufficiently high relative to that of the differential current circuitry 2, because the emitter of transistor 12 is connected to the differential current circuitry 2. Thus, the current fed externally to the terminal 8 will flow in the transistor 12 thereby disadvantageously degrading the differential operation of the differential current circuitry 2.

Additionaly, the control voltage $V_c$ is required to vary in a voltage range in which the transistor 12 is not driven into saturation. Due to such a requirement in combination with the fact that the emitter voltage of the transistor 12 is determined by the potential at a junction between the diode 4 and the emitter of the transistor 6, the range in which the control voltage is allowed to vary is undesirably limited by the above potential.

SUMMARY OF THE INVENTION

An object of the invention is to provide a variable impedance circuit which exhibits a high impedance to a control voltage and is scarcely susceptible to generation of distortions.

Another object of the invention is to provide a variable impedance circuit which is well suited to be fabricated in the form of a semiconductor integrated circuit.

Further object of the invention is to provide a variable impedance circuit in which voltage for controlling the value of impedance and hence the impedance value may be varied over a wider range.

In view of the above and other objects which will become more apparent as description proceeds, the invention proposes that the emitter of the transistor of the current control circuitry as connected to the differential current circuitry in the variable impedance circuit described above in conjunction with FIG. 1 be isolated from the differential current and fed from another current supply source. With such a circuit arrangement, it is now possible to provide a higher impedance to the current control circuitry as compared with that of the differential current circuitry, thereby to prevent the current flow in the differential current circuitry from being distorted and, at the same time, enlarging the range in which the control voltage is allowed to vary.

DESCRIPTION OF THE PREFERRED EMBODIMENTS

Figure 1:
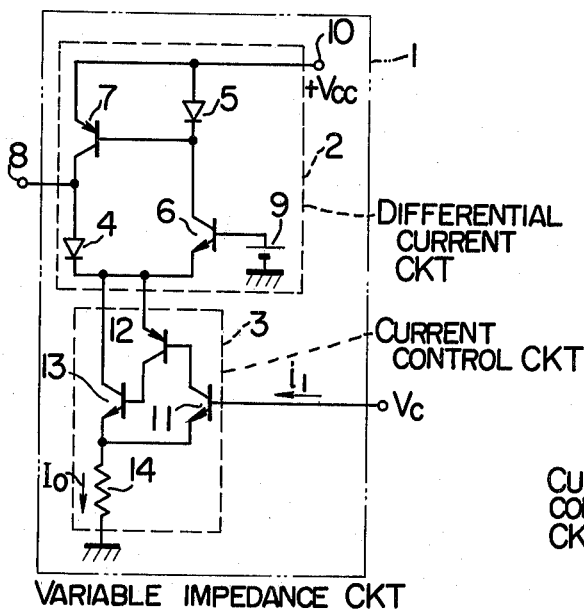
FIG. 1 is a circuit diagram of a hitherto known variable impedance circuit.
Figure 2:
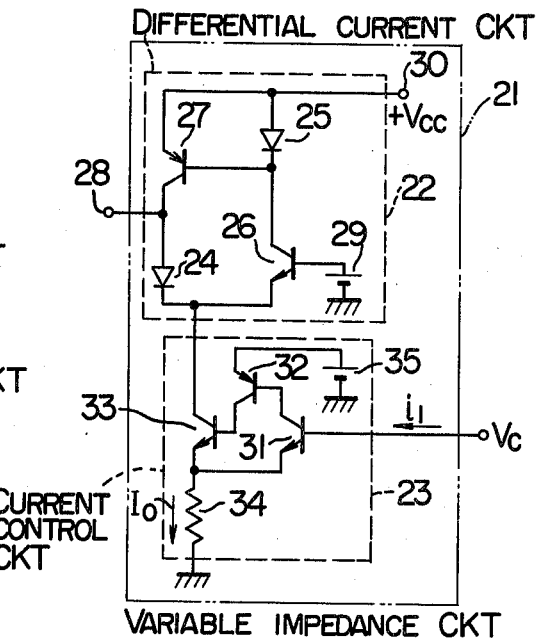
FIG. 2 is a circuit diagram showing a variable impedance circuit embodying the invention.

Referring to FIG. 2 which shows a variable impedance circuit implemented according to the teachings of the invention, the variable impedance circuit generally designated by reference numeral 21 is composed of a differential current circuit 22 and a current control circuit 23 in a similar manner as the hitherto known variable impedance circuit described hereinbefore in conjunction with FIG. 1. In particular, the differential current circuitry 22 is of the same exact arrangement as the one shown in FIG. 1. The impedance as seen from the terminal 28 is equal to a sum of operating resistances of a diode 24 and the base-emitter junction of a transistor 26, wherein current flowing through the diode 24 will vary in inverse proportion to the current flowing through the transistor 26.

The current control circuitry 23 includes three transistors. A transistor 31 has a base applied with a control voltage and a collector connected to the base of a transistor 32 which in turn has a collector connected to the base of another transistor 33 and an emitter which is isolated from the differential current circuitry 22 and provided with a power source 35 which is not susceptible to influences of the circuit operation. The transistor 33 has a collector connected to the differential current circuitry 22 and an emitter grounded through a resistor 34. The emitter of the transistor 31 is also grounded through the resistor 34.

Current $i_l$ due to the control voltage $V_c$ is amplified successively through the transistors 31, 32 and 33, in that order, and provides a current source for the differential current circuitry 22.

With the Darlington connection of the transistors 31, 32 and 33, it is intended that the ratio between the current $i_l$ and a current $I_o$ flowing through the resistor 34 and hence the impedance to the control voltage $V_c$ are increased, thereby to prevent the control voltage from being varied under the influence of current in the current control circuitry 23.

The transistors 31 and 33 are of NPN-type, while the transistor 32 is of PNP-type. With the arrangement such that the transistor 32 at the intermediate stage is connected with the opposite polarity to the other transistors 31 and 33 and adapted to be applied with a bias voltage at the emitter with the collector-base path connected in the Darlington configuration, it is intended that a voltage drop between the base of the transistor 31 and the emitter of the transistor 33 is suppressed possibly to a minimum, that is to say, a voltage across the resistor 34 is brought near to the control voltage $V_c$. In this connection, it will be appreciated that the current $I_o$ is given by a voltage across the resistor 34 divided by the resistance value R thereof. Accordingly, if the voltage drop between the base of the transistor 31 and the emitter of the transistor 33 is high, then the circuit will not be operative with a low control voltage $V_c$. For this reason, it is necessary to reduce the voltage drop to a level as low as possible. In the case of the circuit shown in FIG. 2, the voltage drop between the base of the transistor 31 and the emitter of the transistor 33 corresponds to only the voltage drop $V_{BE}$ across the base-emitter junction of the transistor 31, so that the circuit may become operative with a small value of the control voltage $V_c$.

The emitter of the transistor 32 is connected to a current source 35 which has to meet the conditions described below.

If the maximum value of the control voltage $V_c$ is represented by the sum of a reference value $V_{co}$ and a maximum positive variation $\Delta V$ thereof, i.e. $V_c = V_{co} + \Delta V$, while the potential difference appearing across the base-collector junction of the transistor 31 in the saturated state thereof is represented by $V_{Fl}$, then the collector voltage of the transistor 31 at which it becomes saturated for a maximum value of the control voltage $V_c$ is given by $V_{co} + \Delta V - V_{Fl}$. Accordingly, in order to prevent the transistor 31 from being saturated, the voltage $V_{rl}$ of the power source 35 must be higher than $V_{co} + \Delta V - V_{fl}$ plus the voltage $V_{BE}$ across the base-emitter junction of the transistor 32 and additionally lower than the bias voltage $V_{cc}$. In other words, the condition $V_{cc} \geq V_{rl} \geq V_{co} + \Delta V - V_{Fl} + V_{BE}$ must be satisfied. It will be appreciated that, in place of providing such a separate power source 35, the emitter bias voltage of the transistor 32 may be derived from the biase source $+V_{cc}$ for the differential current circuitry 22.

The current $I_o$ will vary in proportion to variation in the control voltage $V_c$ thereby to control the current flowing through the differential current circuitry 22, as a result of which the impedance as seen from the terminal 28 will vary in proportion to the control voltage $V_c$.

It will be appreciated from the foregoing description that the current fed to the terminal 28 of the variable impedance circuit according to the invention will scarcely flow into the current control circuitry 23, because the emitter of the transistor 32 is isolated from the differential current circuitry. The impedance of collector path of the transistor 33 is sufficiently great. Thus, the current flowing through the transistor 26 is decreased as the current flowing through the diode 24 is increased, while the sum of both of these currents will remain substantially constant independently from the current flow at the terminal 28. This means that distortion of the impedance can be significantly reduced.

Further, since the transistors 31 and 32 will not be saturated, the range in which the control voltage $V_c$ is allowed to vary is determined only by the saturating conditions of the transistor 33, and thus can be selected with a greater freedom as compared with the hitherto known variable impedance circuit.

Figure 3:
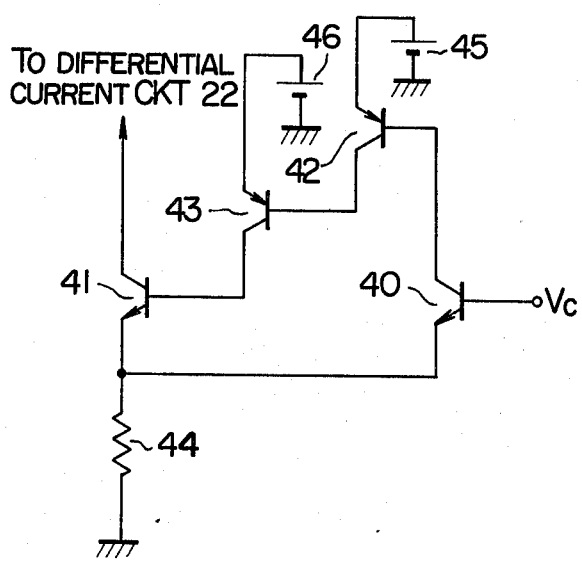
FIG. 3 is a circuit diagram to show another exemplary embodiment the current control circuitry of a variable impedance circuit according to the invention.

Referring to FIG. 3 which shows another embodiment of the current control circuit according to the invention, a transistor 40 is of NPN-type and has a base adapted to be applied with the control voltage $V_c$ and an emitter grounded through a resistor 44. A transistor 41 has a collector connected to the differential current circuitry 22 and an emitter grounded through a resistor 44. A transistor stage interposed between the transistors 40 and 41 in Darlington connection comprises two PNP-type transistors 42 and 43 in contrast to the single PNP transistor 32 employed in the current control circuit shown in FIG. 2. More specifically, the collector of the transistor 40 is connected to the base of the transistor 42 which has a collector connected to the base of the transistor 43, the collector of which in turn is connected to the base of the transistor 41.

Emitters of the transistors 42 and 43 are connected to current sources 45 and 46.

The voltage $V_{r1}'$ of the source 45 has to satisfy the condition that $V_{cc} \geq V_{r1}' \geq V_{co} + \Delta V - V_F + V_{BE}$, as is the case with the source 35 described hereinbefore in conjunction with FIG. 2. On the other hand, the voltage $V_{r2}$ of the power source 46 has to meet the condition that $V_{cc} \geq V_{r2} \geq V_{r1}' + V_{BE} = V_{co} + \Delta V - V_F + 2V_{BE}$. It will be noted that the collector voltage of the transistor 42 at which the latter is saturated is substantially equal to the voltage $V_{r1}'$ of the source 45.

It will be self-explanatory that the transistors 42 and 43 may be connected to a common power source in such a manner that the respective conditions for the emitter voltages described above can be satisfied in place of using separate power sources 45 and 46 as shown in FIG. 3.

When the transistor 40 is applied with the control voltage at the base thereof, the base current will be successively amplified through the transistors 40, 42, 43 and 41 in this order. The current in the collector-emitter path of the transistor 41 is in proportion to the control voltage $V_c$. Since the current control circuitry shown in FIG. 3 has an additional transistor stage as compared with the current control circuitry shown in FIG. 2, the ratio of amplification of the current flowing through the resistor 44 relative to the base current of the transistor 40 is increased, which in turn means that the impedance of the current control circuitry to the control voltage is correspondingly further increased. Thus, it is possible to obtain a current which is more accurately proportional to the control voltage.

Obviously, more than two PNP transistors may be interposed between the collector of the transistor 40 and the base of the transistor 41 in Darlington connection.

Figure 4:
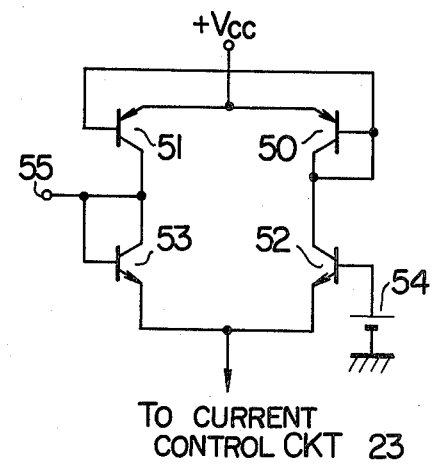
FIG. 4 is a circuit diagram to show another exemplary embodiment of the differential current circuitry of a variable impedance circuit according to the invention.

FIG. 4 shows another embodiment of the differential current circuitry according to the invention which is different from the one shown in FIG. 2 in that the diodes 24 and 25 of the latter are replaced by transistors each having base and collector short-circuited to each other so that a PN-junction thereof will operate effectively as a diode. The operation of the differential current circuitry shown in FIG. 4 is therefore substantially same as that of the circuitry shown in FIG. 2.

More specifically, the differential current circuitry shown in FIG. 4 comprises PNP- and NPN-transistors 50 and 52 having respective collectors connected together and PNP- and NPN transistors 51 and 53 having respective collectors also connected together. The emitters of the transistors 50 and 51 are connected together and applied with a bias voltage $V_{cc}$, while the emitters of the transistors 52 and 53 are both connected to the current control circuitry 23. Terminal 55 constitutes the output terminal for the variable impedance circuit. The transistor 50 has a base connected to the base of the transistor 51. A power source 54 may be the same as the power source 29 shown in FIG. 2.

The base and collector of each of the transistors 50 and 53 are short-circuited to each other so that the respective PN-junctions will serve as diodes. The circuit arrangement and operation of the differential current circuitry shown in FIG. 4 are equivalent to those of the circuitry shown in FIG. 2. Further description on operation of the differential current circuitry shown in FIG. 4 will be unnecessary.

It is finally added that the variable impedance circuit according to the invention is suited to be implemented in a semiconductor integrated circuit.

We claim:

1. A variable impedance circuit, comprising:
a differential current circuit including a semi-conductor element having at least one PN-junction, a first transistor having a collector, a base, an emitter, an emitter-base junction and a collector-base junction with said emitter-base junction being connected to said PN-junction of said semiconductor element with opposite polarities relative to each other, a current supply means for supplying current to the connection between said PN-junction and said base-emitter junction therethrough, and an impedance terminal connected to said PN-junction at the side opposite to the connection to said emitter-base junction;
a current control circuit including a resistor, a second transistor having a base, a collector connected to said connection between said emitter-base junction of said first transistor and said PN-junction of said semiconductor element and an emitter grounded through said resistor, a third transistor of same conduction type as that of said second transistor having a base adapted to be applied with a control voltage, an emitter connected to the emitter of said second transistor and a collector connected to a fourth transistor of a conduction type opposite to that of said second and third transistors, said fourth transistor having a collector connected to the base of said second transistor, a base connected to said collector of said third transistor and an emitter, wherein current flowing through said second transistor is adapted to control current flowing through said differential current circuit, wherein impedance at said impedance terminal is given by an operating resistance determined by a current flowing through said PN-junction of said semiconductor element and a current flowing said emitter-base junction of said first transistor, and wherein said emitter of said fourth transistor is actuated with a voltage from a first power source which is electrically isolated from said differential current circuit to provide a high impedance to said current control circuit as seen by said differential current circuit.

2. A variable impedance circuit as set forth in claim 1, wherein said current control circuitry further includes a fifth transistor of the same conduction type as that of said fourth transistor having a base connected to the collector of said fourth transistor, a collector connected to the base of said second transistor and an emitter adapted to be applied with a voltage from a second power source electrically isolated from differential current circuitry.

3. A variable impedance circuit as set forth in claim 1, wherein said semiconductor element is constituted by a diode having a single PN-junction.

4. A variable impedance circuit as set forth in claim 1, wherein said semiconductor element is constituted by a transistor having a collector, a base and an emitter with said collector and base being short-circuited to each other.

5. A variable impedance circuit as set forth in claim 1, wherein the source voltage $V_{r1}$ of said first power source satisfies the following condition:

$$V_{cc} \geq V_{r1} \geq V_{co} + \Delta V - V_{F1} + V_{BE}$$

where
- $V_{co}$: reference value of said control voltage,
- $\Delta V$: maximum variation of said control voltage in a positive direction,
- $V_{F1}$: potential difference appearing across the corrector-base junction of said third transistor upon saturation thereof,
- $V_{BE}$: potential difference across the base-emitter junction of said fourth transistor, and
- $V_{cc}$: maximum potential in said differential current circuitry.

6. A variable impedance circuit as set forth in claim 2, wherein the first source voltage $V_{r1}'$ of said first power source satisfies the condition:

$$V_{cc} \geq V_{r1}' \geq V_{co} + \Delta V - V_{F1} + V_{BE}$$

while the second source voltage $V_{r2}$ of said second power source satisfies the condition:

$$V_{cc} \geq V_{r2} \geq V_{co} + \Delta V - V_F + 2V_{BE}$$

where
- $V_{co}$: reference value of said control voltage,
- $\Delta V$: maximum variation of said control voltage in a positive direction,
- $V_{F1}$: potential difference appearing across the collector-base junction of said third transistor upon saturation thereof,
- $V_{BE}$: potential difference across the base-emitter junction of said first and second transistors for intermediate amplification, and
- $V_{cc}$: maximum potential in said differential current circuit.

7. A variable impedance circuitry as set forth in claim 6, wherein said first and second source voltages are provided by a single common power source which satisfies both of said conditions.

* * * * *